United States Patent
Kishi et al.

(10) Patent No.: US 9,999,123 B2
(45) Date of Patent: Jun. 12, 2018

(54) CONNECTION STRUCTURE OF CIRCUIT MEMBER, CONNECTION METHOD, AND CONNECTION MATERIAL

(71) Applicant: Panasonic Intellectual Property Management Co., Ltd., Osaka (JP)

(72) Inventors: Arata Kishi, Osaka (JP); Tadashi Maeda, Osaka (JP); Tadahiko Sakai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 74 days.

(21) Appl. No.: 15/075,064

(22) Filed: Mar. 18, 2016

(65) Prior Publication Data
US 2016/0316554 A1 Oct. 27, 2016

(30) Foreign Application Priority Data
Apr. 23, 2015 (JP) ................................ 2015-088001

(51) Int. Cl.
*H05K 1/02* (2006.01)
*H05K 1/11* (2006.01)
(Continued)

(52) U.S. Cl.
CPC .......... *H05K 1/0274* (2013.01); *B23K 1/0016* (2013.01); *B23K 35/26* (2013.01); *B23K 35/264* (2013.01); *B23K 35/362* (2013.01); *B23K 35/3613* (2013.01); *H05K 1/11* (2013.01); *H05K 1/14* (2013.01); *H01R 12/714* (2013.01);
(Continued)

(58) Field of Classification Search
CPC .......... H05K 1/111; H05K 2201/2036; H05K 2201/10909; H05K 2201/10916; H05K 1/09; H05K 1/092; H05K 1/097; H05K 2201/0133; H05K 2201/0218; H05K 2201/0129; H05K 2201/0195;
(Continued)

(56) References Cited

U.S. PATENT DOCUMENTS

| | | | |
|---|---|---|---|
| 4,666,078 A | | 5/1987 | Ohno |
| 4,735,847 A | * | 4/1988 | Fujiwara .................. H01R 4/04 428/209 |

(Continued)

FOREIGN PATENT DOCUMENTS

| | | |
|---|---|---|
| JP | 58-182684 | 10/1983 |
| JP | 60-170176 A | 9/1985 |

(Continued)

*Primary Examiner* — Binh Tran
(74) *Attorney, Agent, or Firm* — Pearne & Gordon LLP

(57) ABSTRACT

A connection structure of circuit members includes a first circuit member, a second circuit member, and a joint portion. The first circuit member has a first main surface on which a light-transparent electrode is provided. The second circuit member has a second main surface on which a metal electrode is provided. The joint portion is interposed between the first main surface and the second main surface. The joint portion includes a resin portion and a solder portion. The solder portion electrically connects the light-transparent electrode and the metal electrode. The light-transparent electrode contains an oxide that includes indium and tin, and the solder portion contains bismuth and indium.

28 Claims, 5 Drawing Sheets

(51) Int. Cl.
*B23K 1/00* (2006.01)
*B23K 35/26* (2006.01)
*B23K 35/36* (2006.01)
*B23K 35/362* (2006.01)
*H05K 1/14* (2006.01)
*H05K 1/09* (2006.01)
*H05K 1/00* (2006.01)
*H05K 7/00* (2006.01)
*H01R 12/71* (2011.01)

(52) U.S. Cl.
CPC .............. *H05K 1/09* (2013.01); *H05K 1/092* (2013.01); *H05K 1/097* (2013.01); *H05K 1/111* (2013.01); *H05K 2201/0133* (2013.01); *H05K 2201/0218* (2013.01); *H05K 2201/0326* (2013.01); *H05K 2201/10909* (2013.01); *H05K 2201/10916* (2013.01); *H05K 2201/2036* (2013.01)

(58) Field of Classification Search
CPC ..... H05K 2201/023; H05K 2201/0239; H05K 3/321; H01R 12/714
USPC ....... 361/748, 751, 760, 767, 770, 771, 803, 361/804; 174/257, 259
See application file for complete search history.

(56) References Cited

U.S. PATENT DOCUMENTS

| | | | |
|---|---|---|---|
| 8,373,067 B2* | 2/2013 | Derda | H01R 12/62 |
| | | | 174/68.1 |
| 2007/0131868 A1* | 6/2007 | Capote | H01L 27/14634 |
| | | | 250/370.13 |
| 2010/0015004 A1 | 1/2010 | Ueshima | |
| 2011/0114954 A1* | 5/2011 | Lee | H01L 51/5246 |
| | | | 257/59 |
| 2012/0255766 A1 | 10/2012 | Igarashi | |
| 2013/0000964 A1* | 1/2013 | Kobayashi | H01B 1/22 |
| | | | 174/257 |

FOREIGN PATENT DOCUMENTS

| | | |
|---|---|---|
| JP | 2001-198692 A | 7/2001 |
| JP | 2010-073394 A | 4/2010 |
| JP | 2010-226140 A | 10/2010 |
| JP | 4831069 B2 | 12/2011 |
| JP | 2012-190804 | 10/2012 |
| JP | 2013-076045 A | 4/2013 |

* cited by examiner

US 9,999,123 B2

CONNECTION STRUCTURE OF CIRCUIT MEMBER, CONNECTION METHOD, AND CONNECTION MATERIAL

BACKGROUND

1. Technical Field

The present disclosure relates to a connection structure of a circuit member including a light-transparent electrode, and a circuit member including a metal electrode in accordance with a solder material.

2. Description of the Related Art

Typically, a light-transparent circuit member such as a glass substrate includes a light-transparent electrode. For example, in a case of electrically connecting a liquid crystal display substrate and a flexible substrate (FPC), it is necessary to connect a metal electrode of the FPC and a light-transparent electrode of the liquid crystal display substrate. However, the light-transparent electrode is less likely to be wetted to a melted solder material, and thus it is difficult to achieve a satisfactory connection state. Accordingly, there is suggested a technology in which the light-transparent electrode is coated with a metal plating with high wettability, and then the metal electrode and the light-transparent electrode are connected to each other with a solder material (refer to Japanese Patent Unexamined Publication No. 58-182684).

However, when coating the light-transparent electrode with the metal plating, the cost increases. On the other hand, an inter-electrode connection method, which is called a chip on glass (COG) or film on glass (FOG) which uses an anisotropic conductive film (ACF) instead of the solder material, is suggested (refer to Japanese Patent Unexamined Publication No. 2012-190804).

SUMMARY

According to an aspect of the disclosure, there is provided a connection structure for circuit members. The connection structure includes a first circuit member, a second circuit member, and a joint portion. The first circuit member has a first main surface on which a light-transparent electrode is provided. The second circuit member has a second main surface on which a metal electrode is provided. The joint portion is interposed between the first main surface and the second main surface. The joint portion includes a resin portion and a solder portion. The solder portion electrically connects the light-transparent electrode and the metal electrode. The light-transparent electrode contains an oxide that includes indium and tin, and the solder portion contains bismuth and indium.

According to another aspect of the disclosure, there is provided a circuit member connection method of connecting a first circuit member that has a first main surface on which a light-transparent electrode is provided, and a second circuit member that has a second main surface on which a metal electrode is provided. In the connection method, (i) a connection material that contains an adhesive and a solder material that is dispersed in the adhesive is prepared. (ii) The first circuit member and the second circuit member are disposed in such a manner that the light-transparent electrode and the metal electrode oppose each other through the connection material. (iii) At least one of the first circuit member and the second circuit member is heated while compressing the second circuit member to the first circuit member to melt the solder material. Then, the heating is stopped to solidify the solder material that is melt so as to form a solder portion that electrically connects the light-transparent electrode and the metal electrode. (iv) The adhesive is cured to form a resin portion that bonds the first circuit member and the second circuit member. The light-transparent electrode contains an oxide including indium and tin, and the solder material contains a bismuth-indium alloy.

According to still another aspect of the disclosure, there is provided a connection material that is used to connect a first circuit member that has a first main surface on which a light-transparent electrode that contains an oxide including indium and tin is provided, and a second circuit member that has a second main surface on which a metal electrode is provided. The connection material contains an adhesive, and a solder material that is dispersed in the adhesive. The solder material contains a bismuth-indium alloy.

According to the present disclosure, it is possible to provide a connection structure for circuit members in which a residual stress is small, and which is excellent in connection reliability.

DETAILED DESCRIPTION OF THE PREFERRED EMBODIMENT

Prior to description of an exemplary embodiment of the present disclosure, a problem in a technology of the related art will be described in brief. Conductive particles, which are contained in ACF, are formed from resin particles and a conductive layer that covers the surface of the resin particles. For example, the conductive particles are compressed between electrodes at a high temperature close to 200° C., and a high pressure of 50 MPa to 150 MPa to achieve electrical contact with the electrodes.

As described above, in circuit members which are connected with ACF, in addition to an expansion and contraction stress due to heat, a consideration deformation due to a pressure during compression occurs. On the other hand, in a circuit member including a light-transparent electrode, thinning of a substrate is in progress, and thus a problem due to the stress is significant.

In addition, when being exposed to a high temperature, the conductive particles contained in ACF expand, and thus a contact area with an electrode decreases. Accordingly, contact resistance tends to increase.

Hereinafter, an exemplary embodiment of the present disclosure will be described with reference to the accompanying drawings. However, the following drawings are illustrative only, and are not intended to limit the present disclosure.

Figure 1:
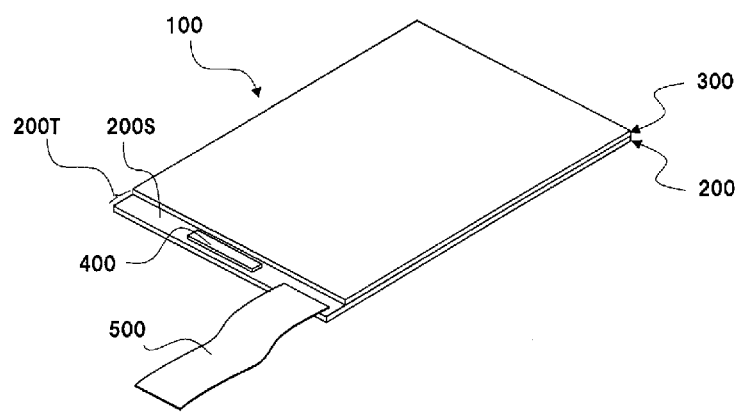
FIG. 1 is a perspective view illustrating the external appearance of a display panel that is an example of an electronic apparatus having a connection structure according to an embodiment of the present disclosure.

FIG. 1 is a perspective view illustrating the external appearance of an example of a display panel. Display panel 100 in an illustrated example contains glass substrate 200, glass substrate 300, an image forming unit that is interposed between glass substrate 200 and glass substrate 300, driving driver 400 that drives the image forming unit, and connector 500 that connects display panel 100 to other components. Driving driver 400 is mounted on first main surface 200S that is one surface of edge portion 200T provided on one end of glass substrate 200 that is a first circuit member. Connector 500 is connected to another position of first main surface 200S. In a case of display panel 100 of the illustrated example, both driving driver 400 and connector 500 correspond to a second circuit member.

Figure 2:
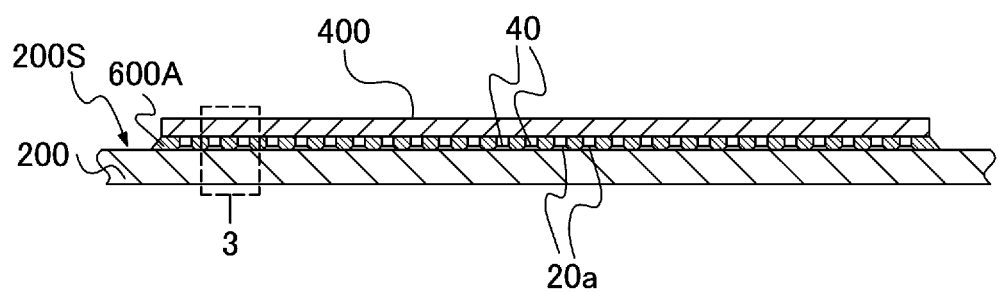
FIG. 2 is a cross-sectional view of a main portion of the display panel illustrated in FIG. 1.
Figure 3:
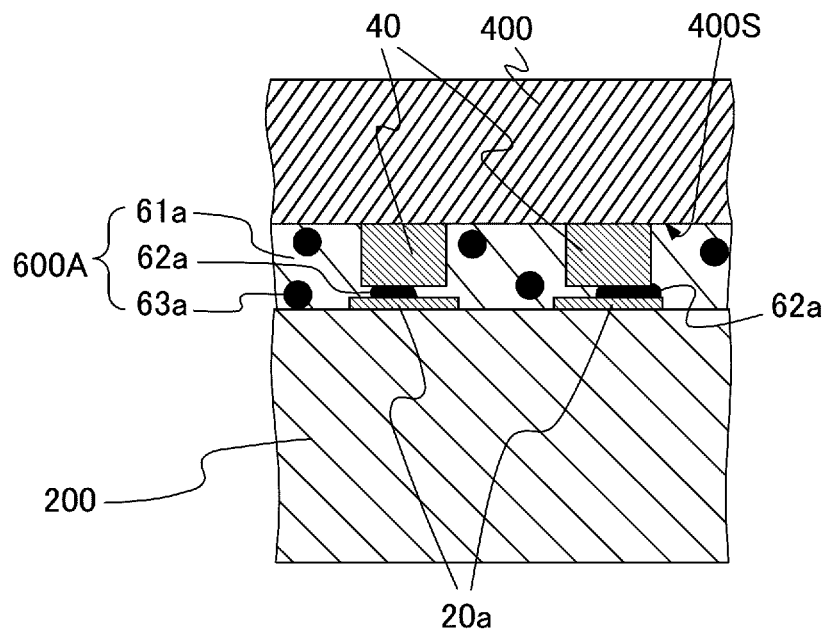
FIG. 3 is an enlarged view of a region surrounded by a broken line in FIG. 2.

FIG. 2 is a longitudinal cross-sectional view of a connection structure including main portions of display panel 100, that is, glass substrate 200 that is the first circuit member, driving driver 400 that is the second circuit member, and joint portion 600A that is interposed therebetween. FIG. 3 illustrates an enlarged view of a region that is surrounded by broken line 3 in FIG. 2. As illustrated in FIG. 2, plurality of connection terminals 20a, which are light-transparent electrodes, are formed on first main surface 200S of glass substrate 200. On the other hand, a surface of driving driver 400, which opposes glass substrate 200, corresponds to second main surface 400S.

Plurality of connection terminals 20a are arranged on first main surface 200S with a predetermined pitch. On the other hand, plurality of bumps 40, which are metal electrodes, are arranged on second main surface 400S with the same pitch. Plurality of bumps 40 of driving driver 400 are aligned to oppose plurality of connection terminals 20a. Joint portion 600A is interposed between first main surface 200S and second main surface 400S. As illustrated in FIG. 3, typically, joint portion 600A includes resin portion 61a, solder portion 62a, and particle-shaped solder material 63a.

Solder portion 62a is a portion that contributes to electrical connection between each of connection terminals 20a and each of bumps 40, and is solidified in a state of being wetted to connection terminal 20a and bump 40. According to this, although not illustrated, a first alloy layer, which contains indium that is contained in connection terminal 20a and bismuth that is contained in solder material 63a, is formed between connection terminal 20a and solder portion 62a. In addition, a second alloy layer, which contains a metal component that is contained in bump 40 and bismuth and/or indium which are contained in solder material 63a, is formed between bump 40 and solder portion 62a. On the other hand, particle-shaped solder material 63a has no relation to electrical connection between connection terminal 20a and bump 40.

Resin portion 61a bonds first main surface 200S and second main surface 400S to each other, and covers solder portion 62a to protect solder portion 62a. In the illustrated example, resin portion 61a is formed to fill a gap between both electrodes and solder portion 62a.

Figure 4:
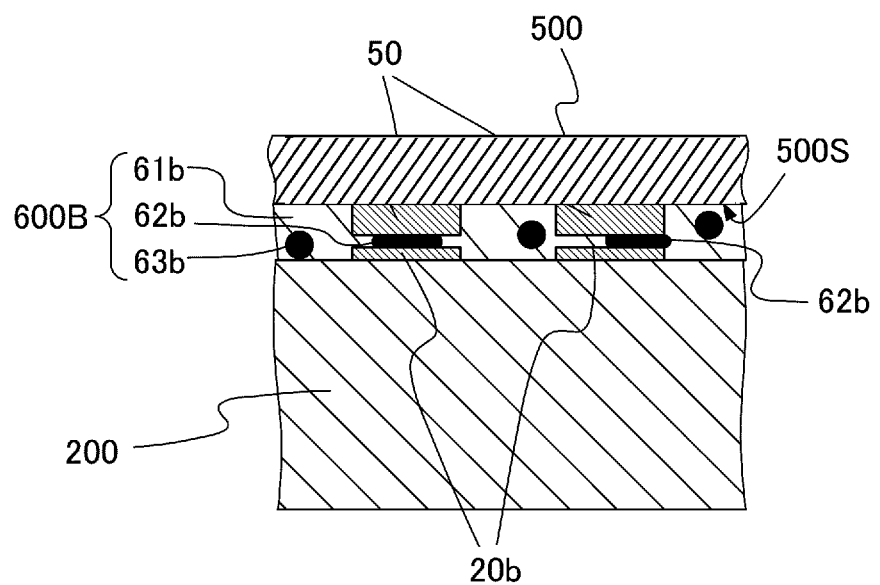
FIG. 4 is an enlarged view of a cross-section of another main portion of the display panel illustrated in FIG. 1.

FIG. 4 is an enlarged view of a longitudinal cross-section of the connection structure including other main portions of display panel 100, that is, glass substrate 200 that is the first circuit member, connector 500 that is the second circuit member, and joint portion 600B that is interposed therebetween. For example, connector 500 includes a flexible substrate that is formed from a polyamide resin and the like, and a wiring pattern that is formed on the substrate from a copper alloy and the like.

Plurality of connection terminals 20b, which are light-transparent electrodes, are arranged on first main surface 200S of glass substrate 200 with a predetermined pitch. On the other hand, plurality of leads 50, which are metal electrodes, are arranged on second main surface 500S (surface that faces glass substrate 200) of connector 500 with the same pitch. Plurality of leads 50 are aligned to oppose plurality of connection terminals 20b. Joint portion 600B is interposed between first main surface 200S of glass substrate 200 and second main surface 500S of connector 500.

Joint portion 600B includes resin portion 61b, solder portion 62b, and particle-shaped solder material 63b, and the respective portions have the same structure as that of joint portion 600A. Accordingly, although not illustrated, a first alloy layer, which contains indium that is contained in each of connection terminals 20b and bismuth that is contained in solder material 63b, is formed between connection terminal 20b and solder portion 62b. In addition, a second alloy layer, which contains a metal component that is contained in each of leads 50 and bismuth and/or indium which are contained in solder material 63b, is formed between lead 50 and solder portion 62b.

Next, description will be given of a circuit member connection method according to the exemplary embodiment of the present disclosure. The connection method is a method of connecting a first circuit member having a first main surface on which a light-transparent electrode is provided, and a second circuit member having a second main surface on which a metal electrode is provided. The connection method includes (i) a process of preparing a connection material that contains an adhesive and a solder material that is dispersed in the adhesive, the solder material containing a bismuth-indium alloy.

The adhesive is a raw material of the resin portion, and is a resin composition such as a thermosetting resin, a photo-curable resin, and a thermoplastic resin. The resin composition may contain an activator, filler, a curing agent of a resin component, and the like as to be described before. In a case of using the thermosetting resin, although not particularly limited, it is preferable that a curing temperature of the thermosetting resin is higher than the melting point of the solder material. It is preferable that the curing of the thermosetting resin is completed after the solder material is melted, and the light-transparent electrode and the metal electrode are wetted by the solder material. The connection material may have a paste shape or a film shape.

As the activator that reduces a surface of the light-transparent electrode and the like through heating, an organic acid, an organic acid salt of amine, a halide salt of amine, and the like can be used. Among these, the organic acid is preferable in consideration of appropriate activity. As the organic acid, adipic acid, abietic acid, sebacic acid, glutaric acid, 4-phenylbutyric acid, levulinic acid, and the like can be used. These may be used alone, or two or more kinds thereof may be arbitrary selected and used in combination.

For example, the bismuth-indium alloy, which is contained in the solder material, has a particle shape. The size of the particles (hereinafter, referred to as "alloy particles") of the bismuth-indium alloy is selected from the viewpoints of securing electrical conduction between the light-transparent electrode and the metal electrode which correspond to each other, and securing insulation between adjacent electrodes. For example, it is preferable that the size (maximum particle size) of the alloy particles is $\frac{1}{5}$ or less times an electrode width, and more preferably $\frac{1}{10}$ or less times. In addition, the solder material may contain components other than the bismuth-indium alloy, but it is preferable that the amount of the bismuth-indium alloy is 95% by mass or greater, and more preferably 98% by mass or greater.

It is preferable that the bismuth-indium alloy contained in the solder material has the melting point (mp) in a range from 72° C. to 109° C., inclusive, more preferably from 85° C. to 109° C., inclusive, and still more preferably from 88° C. to 90° C., inclusive. According to this, for example, connection between electrodes may be performed at a low temperature of 110° C. or lower, and preferably 100° C. or lower. Accordingly, it is possible to significantly reduce a stress due to heat that remains in the circuit members.

Examples of the bismuth-indium alloy having the melting point in a range from 72° C. to 109° C., inclusive, includes 35Bi-65In (mp: 72° C.), 51Bi-49In (mp: 85° C.), 55Bi-45In (mp: 89° C.), 27Bi-73In (mp: 100° C.), 68Bi-32In (mp: 109° C.), and the like. However, XBi-Yin represents an alloy that contains X % by mass of bismuth and Y % by mass of indium.

In addition, in the bismuth-indium alloy contained in the solder material, it is preferable that the amount of indium contained in the bismuth-indium alloy is in a range from 32% by mass to 73% by mass from, inclusive, in the viewpoint of improving electrical connection reliability, more preferably from 32% by mass to 49% by mass, inclusive, and still more preferably from 43% by mass to 47% by mass, inclusive.

In the connection material that contains the adhesive and the solder material, for example, the amount of the solder material may be in a range from 5% by mass to 80% by mass, inclusive. When the amount of the solder material is set in the above-described range, it is easy to make high connection reliability between the light-transparent electrode and the metal electrode, and reliable securement of insulation between adjacent electrodes be compatible with each other.

Next, the connection method includes (ii) a process of disposing the first circuit member and the second circuit member in such a manner that the light-transparent electrode and the metal electrode oppose each other through the connection material. However, the light-transparent electrode represents an oxide including indium and tin.

For example, the connection material is disposed in a region (hereinafter, referred to as "first connection region") that covers at least a part of the light-transparent electrode on the first main surface of the first circuit member. In a case where the connection material has a paste shape and contains a non-cured or semi-cured thermosetting resin or a non-cured photo-curable resin, the connection material may be applied to the first connection region by using a printing device, a dispenser, an inkjet nozzle, and the like. In a case where the connection material has a film shape or tape shape, a film, which is cut out in a predetermined shape, may be compressed to the first connection region after being peeled-off from a base material. For example, this operation is performed by a tape bonding device that is known. In addition, the connection material may be disposed in a region (second connection region) that covers at least a part of the metal electrode on the second main surface of the second circuit member, or may be disposed in both the first connection region and the second connection region. According to this, a stacked structure, in which the first circuit member and the second circuit member are disposed to face each other, is obtained.

Figure 5A:
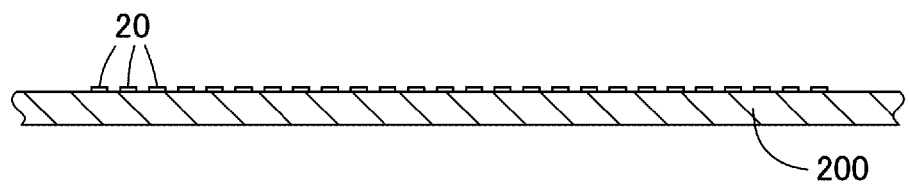
FIG. 5A is a process view illustrating an example of a connection method of manufacturing the connection structure according to the embodiment of the present disclosure.
Figure 5B:
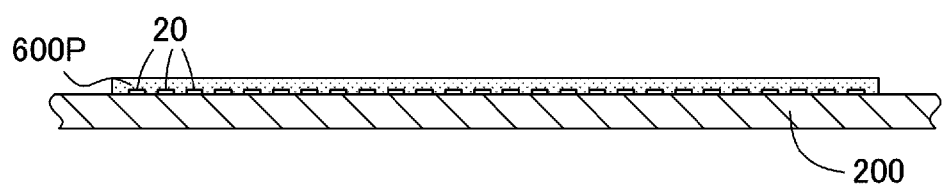
FIG. 5B is a view illustrating a process that continues from FIG. 5A.
Figure 5C:
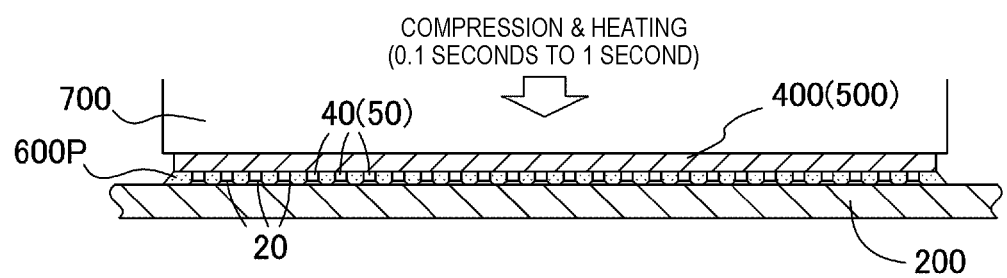
FIG. 5C is a view illustrating a process that continues from FIG. 5B.

FIGS. 5A and 5B illustrate an example of an aspect in which connection material 600P is disposed in the first connection region of first circuit member 200 including light-transparent electrode 20. In addition, FIG. 5C illustrates an example of an aspect in which second circuit member 400 (500) is disposed on first circuit member 200 through connection material 600P. In the illustrated example, second circuit member 400 (500), which is held by suction tool 700, is mounted on first circuit member 200. At this time, positioning is performed in such a manner that light-transparent electrode 20 and metal electrode 40 (50) oppose each other.

In a case where the adhesive contains a thermosetting resin, when disposing the first circuit member and the second circuit member to oppose each other, temporary compression, in which connection material 600P is heated for a short time, may be performed. According to this, it is possible to prevent positional deviation between the first circuit member and the second circuit member. For example, in the temporary compression, heating may be performed with respect to connection material 600P to a certain extent, at which the solder material is not melted and the adhesive is slightly cured, through the second circuit member (or the first circuit member) by suction tool 700 provided with a heating unit such as a heater.

During the temporary compression, for example, a pressure for compression of the first circuit member and/or the second circuit member may be 0.5 MPa to 1.0 MPa. For example, a temporary compression time may be approximately 0.1 seconds to 1 second. For example, a temporary compression temperature may be a temperature that is equal to or lower than the melting point of the solder material by 10° C.

Next, in the connection method, (iii) a process of heating at least one of the first circuit member and the second circuit member while compressing the second circuit member to the first circuit member to melt the solder material is performed. Then, the heating is stopped, and the solder material that is melt is solidified. According to this, the solder portion that electrically connects the light-transparent electrode and the metal electrode is formed. In addition, when the second circuit member is compressed to the first circuit member, the first circuit member is also compressed to the second circuit member. That is, a compression tool may be pressed to any circuit member.

The process (iii) is a so-called thermal compression process. A temperature for heating of the first circuit member and/or the second circuit member during the thermal compression may be equal to or higher than the melting point of the solder material that is contained in the connection material, and may be a temperature that is equal to or higher than the melting point and equal to or lower than the melting point+10° C. For example, when the melting point of the bismuth-indium alloy contained in the solder material is 88° C. to 90° C., the heating temperature may be 90° C. or higher to 100° C. or lower. According to this, it is possible to significantly lower the heating temperature in comparison to a case of using ACF.

A pressure for compression of the first circuit member and/or the second circuit member during the thermal compression may be 0.5 MPa to 4 MPa, and approximately 1 MPa to 2 MPa is preferable. The reason for the preference is as follows. Since the solder material is melted, even though a too high pressure is not applied to the circuit members, it is possible to easily secure electrical connection due to wetting between the electrode and the solder material. According to this, it is possible to significantly reduce a pressure that is applied to the circuit members in comparison to the case of using ACF.

In addition, although not particularly limited, a thermal compression time is preferably approximately 0.5 seconds to 10 seconds, and more preferably 1 second to 5 seconds in consideration of the manufacturing cost.

Figure 5D:
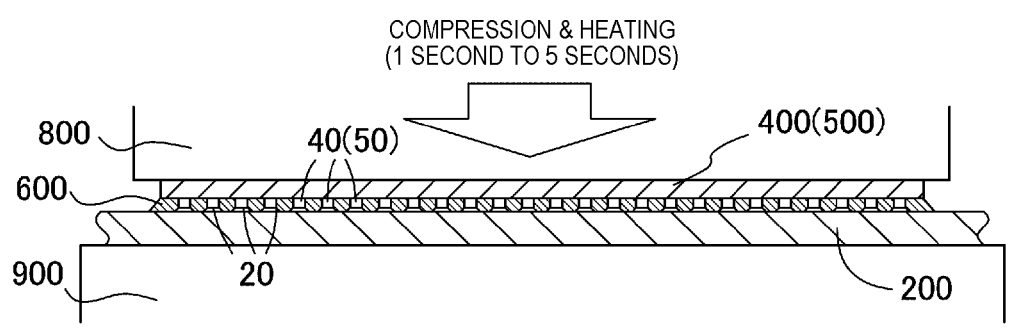
FIG. 5D is a view illustrating a process that continues from FIG. 5C.

FIG. 5D illustrates an example of an aspect in which first circuit member 200 and second circuit member 400 (500) are thermally compressed. Here, a case where the thermal compression is performed on stage 900 by thermal compression tool 800. Then, thermal compression tool 800 is separated from second circuit member 400 (500), and heating is stopped to solidify the solder. According to this, a solder portion that electrically connects light-transparent electrode 20 and metal electrode 50 is formed.

In the progress of the thermal compression, a reaction between a part of indium that is contained in the light-transparent electrode and a part of bismuth that is contained in the solder material progresses at an interface between the light-transparent electrode and the solder material, and thus the first alloy layer is formed. The first alloy layer is common to the solder portion when considering the first alloy layer contains bismuth and indium. On the other hand, the first alloy layer contains an alloy different from the solder portion, and this alloy is different from the solder portion, for example, in a composition and/or a structure. Typically, it is considered that a reaction between the light-transparent electrode and the solder material is less likely to progress. However, in a case of using the bismuth-indium alloy having a low melting point as described above as the solder material, the first alloy layer is formed. The presence of the first alloy layer can be confirmed with the naked eye when enlarging a cross-section of the interface between the solder portion and the light-transparent electrode.

Similarly, a reaction between a part of a metal component that is contained in the metal electrode and a part of at least one of bismuth and indium which are contained in the solder material progresses at the interface between the metal electrode and the solder material, and thus a second alloy layer is formed. The presence of the second alloy layer can also be confirmed with the naked eye when enlarging a cross-section of the interface between the solder portion and the metal electrode.

In the connection method, (iv) a process of curing the adhesive to form a resin portion that bonds the first circuit member and the second circuit member. The process (iv) can be performed in combination with the thermal compression in the process (iii). For example, in a case where the adhesive contains a thermosetting resin, the curing reaction of the thermosetting resin can be allowed to progress during the thermal compression to cure the adhesive. At this time, when the curing is not sufficient, after-curing may be performed. In addition, in a case where the adhesive contains a thermoplastic resin, the thermoplastic resin may be melted during the thermal compression to weld the first main surface of the first circuit member to the second main surface of the second circuit member, and then solidification (curing) may be performed. In addition, in a case where the adhesive contains a photo-curable resin, for example, the adhesive may be irradiated with electronic waves or light from the first circuit member side having transparency. However, it is preferable that the irradiation of the electronic waves or light is performed after the solder material is melted. In this case, when the thermal compression is terminated, the joint portion including the resin portion and the solder portion is formed.

In a case where the bonding between the first circuit member and the second circuit member does not progress in combination with the thermal compression in the process (iii), after the process (iii), the adhesive may be heated in combination with the first circuit member and the second circuit member, or the adhesive may be irradiated with the electronic waves or light from the first circuit member side to complete bonding between the first circuit member and the second circuit member.

Next, the present disclosure will be described in more detail on the basis of Examples. However, the present disclosure is not limited to the following Examples.

EXAMPLE 1

Connection Material

As the solder material, alloy particles of a bismuth-indium alloy (55Bi-45In (mp: 89° C.)) were prepared. An average particle size of the alloy particles was 3 µm, and the maximum particle size was 5 µm. On the other hand, a thermosetting resin composition containing 150 parts by mass of a bisphenol A type epoxy resin, 25 parts by mass of imidazole as a curing agent, and 20 parts by mass of adipic acid as an activator was prepared as an adhesive. The composition of the thermosetting resin composition was blended for rapid curing when being heated to 80° C. or higher. Next, 20 parts by mass of alloy particles were dispersed in 100 parts by mass of thermosetting resin composition to prepare a paste-shaped connection material.

First Circuit Member

As the light-transparent electrode, a plurality of ITO electrodes (thickness: 1500 Å) having a width of 50 µm were formed in a stripe shape on one surface (first main surface) of a glass substrate having a thickness of 0.3 mm and a rectangular shape (size: 30 mm×30 mm). A pitch of the ITO electrodes was set to 0.1 mm.

Second Circuit Member

A polyimide resin film substrate (FPC) was prepared in a thickness of 32 µm and a rectangular shape (size: 16 mm×35 mm). A plurality of metal electrodes (height: 15 µm) having a width 50 µm were formed on one surface (second main surface) of FPC in correspondence with the light-transparent electrodes. The metal electrodes were obtained by sequentially performing phosphorous-containing nickel (Ni) plating and gold (Au) plating on a surface of a copper (Cu) base electrode.

Connection Between Circuit Members Through Thermal Compression

The connection material was printed in a first connection region of the first main surface of the first circuit member in which the ITO electrodes were formed in a thickness of 30

μm by using a printing device. Then, the second connection region of the second circuit member in which the metal electrodes were formed was made to face the first connection region, in which the ITO electrodes were provided, through the film of the connection material, thereby obtaining a stacked structure of the first circuit member and the second circuit member.

Next, heating was performed at 100° C. for 10 seconds while compressing the second circuit member with respect to the first circuit member at a pressure of 1.0 MPa by using a thermal compression tool having a flat surface, thereby melting the solder material and curing the adhesive (thermosetting resin composition). Then, the heating was stopped to solidify the solder material, thereby forming the solder portion that electrically connects each of the light-transparent electrodes and each of the metal electrodes. According to this, a connection structure (sample structure body) of the first circuit member and the second circuit member was completed.

Evaluation

Figure 6:
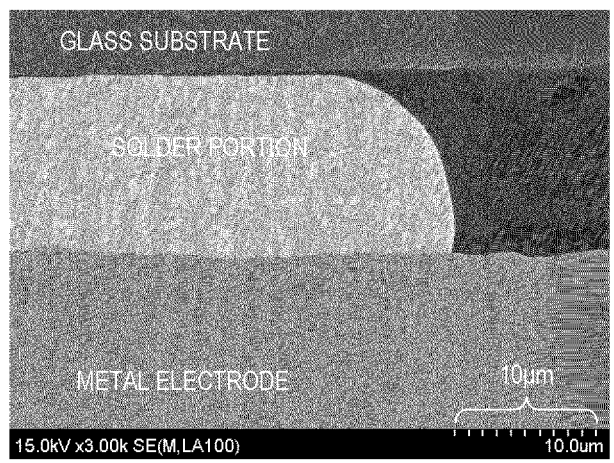
FIG. 6 is a view illustrating an electron microscope observation image of a region including a glass portion of a first circuit member, a solder portion, and a metal electrode portion of a second circuit member in a connection structure of circuit members which is prepared in Example 1 of the present disclosure.
Figure 7:
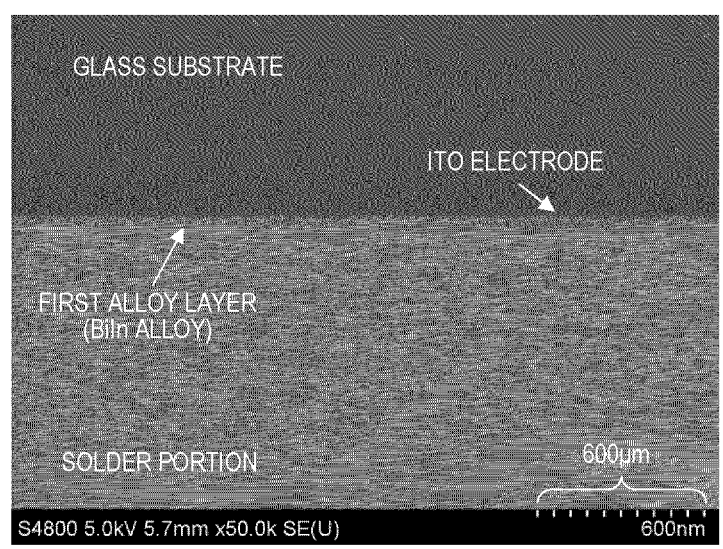
FIG. 7 is a view illustrating an electron microscope observation image of an interface region (first alloy layer formed region) between a light-transparent electrode and a solder portion.
Figure 8:
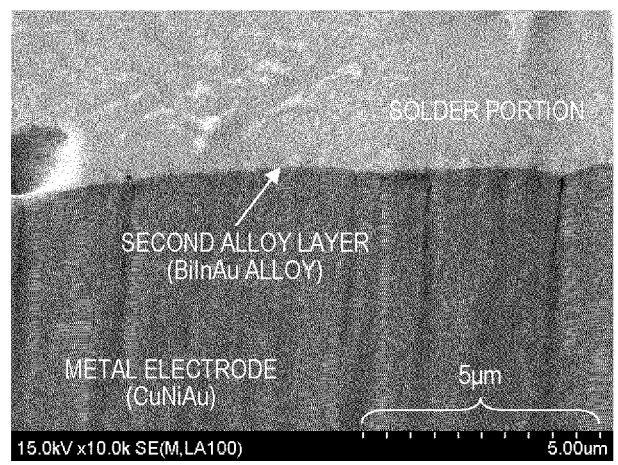
FIG. 8 is a view illustrating an electron microscope observation image of an interface region (second alloy layer formed region) between a metal electrode and a solder portion.
Figure 9:
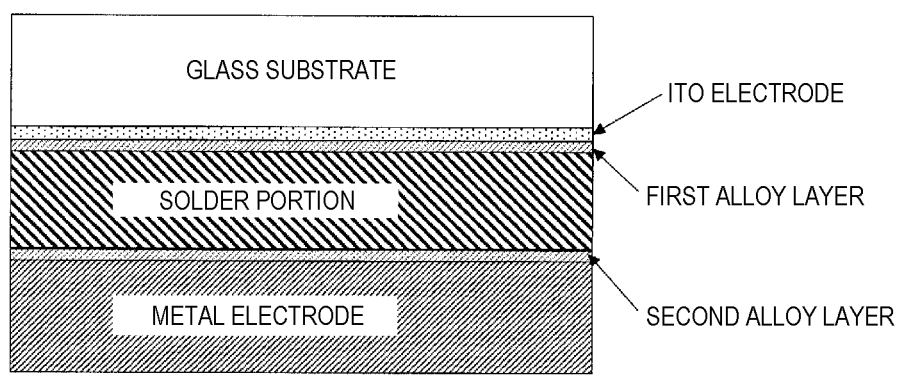
FIG. 9 is a schematic view of a main portion of the connection structure between the light-transparent electrode, the solder portion, and the metal electrode.

The sample structure body was cut in parallel with a stacking direction along a cross-section including the light-transparent electrode, the solder portion, and the metal electrode, and the cross-section was observed with a scanning electron microscope (SEM: product number SU-70, manufactured by Hitachi High-Technologies Corporation). FIG. 6 illustrates an electron microscope observation image in a region including the glass substrate of the first circuit member, the solder portion, and the metal electrode of the second circuit member. In addition, FIG. 7 illustrates an enlarged observation image of an interface region (first alloy layer formed region) between the light-transparent electrode and the solder portion. FIG. 8 illustrates an enlarged observation image of an interface region (second alloy layer formed region) between the metal electrode and the solder portion. On the other hand, FIG. 9 schematically illustrates a main portion of the connection structure between the light-transparent electrode, the solder portion, and the metal electrode.

In FIG. 6, it is difficult to clearly recognize the thin light-transparent electrode. However, it is possible to clearly grasp an aspect in which the solder portion is interposed between the glass substrate of the first circuit member and the metal electrode of the second circuit member for connection thereof.

FIG. 7 is an image of the interface region between the light-transparent electrode (ITO electrode) and the solder portion at a higher magnification in comparison to FIG. 6, and it is possible to confirm the presence of the ITO electrode. In addition, it is possible to recognize that the first alloy layer containing Bi and In is formed at the interface between the ITO electrode and the solder portion.

FIG. 8 is an image of the interface region between the metal electrode and the solder portion at a higher magnification in comparison to FIG. 6, and it is possible to recognize that the second alloy layer containing Bi, In, and Au is formed at the interface between the metal electrode and the solder portion.

As described above, it was confirmed that the cross-section of the connection structure has a multi-layered structure as illustrated in FIG. 9. That is, the first alloy layer is formed between the ITO electrode and the solder portion, and the second alloy layer is formed between the metal electrode and the solder portion. According to this, it is considered that a contact area between the ITO electrode and the solder portion and/or a contact area between the metal electrode and the solder portion is not reduced even under a high temperature. In addition, when performing the thermal compression at a pressure of 1.0 MPa at 100° C. for 10 seconds, a residual stress of the connection structure decreases. Accordingly, even in a case of using a thin glass substrate, it is considered that the problem in the case of using ACF is less likely to occur. As described above, the connection structure of the circuit members according to the exemplary embodiment of the present disclosure includes the first circuit member, the second circuit member, and the joint portion. The first circuit member has the first main surface on which the light-transparent electrode is provide. The second circuit member includes the second main surface on which the metal electrode is provided. The joint portion is interposed between the first main surface and the second main surface. The joint portion includes the resin portion and the solder portion. The solder portion electrically connects the light-transparent electrode and the metal electrode. The light-transparent electrode contains an oxide including indium (In) and tin (Sn). On the other hand, the solder portion contains bismuth (Bi) and indium.

Although not particularly limited, for example, the first circuit member may be a light-transparent substrate that is used in a display panel that is provided to a television, a tablet, a smart phone, a wearable device, and the like. The light-transparent substrate may be translucent. Examples of the light-transparent substrate include a glass substrate and a film-shaped substrate. The film-shaped substrate is formed from a resin film having transparency. Examples of the resin film having transparency include films of polyethylene terephthalate (PET), polycarbonate (PC), polyethylene naphthalate (PEN), and the like. The first main surface may be an arbitrary main surface of the first circuit member.

Although not particularly limited, for example, the second circuit member may be a semiconductor chip, an electronic component package, a film substrate, a connector, and the like. The second main surface may be an arbitrary main surface of the second circuit member.

The light-transparent electrode provided on the first main surface may be an oxide including indium and tin, and may contain a minute amount of a third metal element other than indium and tin. Representative examples of the light-transparent electrode include a so-called indium tin oxide (ITO) electrode.

Although not particularly limited, for example, the metal electrode provided on the second main surface may be an electrode that contains gold, platinum, copper, nickel, palladium, various kinds of solder, and the like. For example, the solder that forms the metal electrode may be solder that contains tin, silver, bismuth, indium, nickel, copper, and the like.

The solder portion contains bismuth and indium. It is preferable that bismuth and indium forms an alloy (bismuth-indium alloy). The solder portion may contain a component other than the bismuth-indium alloy, for example, a third element that does not form the bismuth-indium alloy. In addition, the solder portion may include a bismuth elementary substance region and/or an indium elementary substance region. However, from the viewpoint of homogeneously forming high-reliability solder portion with excellent strength, it is preferable that the amount of the bismuth-indium alloy contained in the solder portion is 97% by mass or greater, and more preferably 99% by mass or greater. In addition, it is still more preferable that the entirety of the solder portion is formed from the bismuth-indium alloy.

The bismuth-indium alloy may contain a minute amount of third element other than bismuth and indium as an alloy component. However, it is preferable that the amount of the third element contained in the bismuth-indium alloy is 1% by mass or less. That is, it is preferable that the solder portion is formed through melting of the bismuth-indium alloy (solder material) that contains a total of 99% by mass or greater of bismuth and indium, and the subsequent solidification.

In addition, a portion, which contains the bismuth-indium alloy that forms the connection structure of the circuit members, is referred to as the solder portion, and a material, which contains the bismuth-indium alloy before forming the connection structure of the circuit members, that is, before melting between the electrodes, is referred to as the solder material.

It is preferable that the first alloy layer, which contains indium and bismuth, is formed between the light-transparent electrode and the solder portion. For example, the first alloy layer is formed from indium that is contained in the light-transparent electrode, and bismuth that is contained in the solder material that forms the solder portion. The first alloy layer may contain indium that is contained in the solder material. However, the first alloy layer is formed from an alloy different from the solder portion. Typically, a composition and/or a structure of the first alloy layer are different from a composition and/or a structure of the solder portion, and thus the presence of the first alloy layer can be confirmed with various analysis methods, for example, a scanning electron microscope, a transmission electron microscope, and the like.

On the other hand, it is preferable that a second alloy layer, which contains a metal component contained in the metal electrode and bismuth and/or indium contained in the solder material that forms the solder portion, is formed between the metal electrode and the solder portion. That is, a metal component, which is common to the metal component that is contained in the metal electrode, may be contained in the second alloy layer. For example, in a case where the metal electrode contains three kinds of elements including copper, nickel, and gold, at least one kind selected from the group consisting of copper, nickel, and gold is contained in the second alloy layer.

Indium, which is contained in the solder material, is excellent in malleability, and thus it is possible to increase a wetting area between the solder material, the light-transparent electrode, and the metal electrode. On the other hand, bismuth is an abnormal liquid of which a volume expands during solidification in a melted state. When the solder material contains bismuth, during solidification of the solder material, a pressure is raised at the interface with the light-transparent electrode and the interface with the metal electrode, and thus a reaction of forming the first alloy layer and the second alloy layer is likely to progress.

In a case of using the solder material, it is possible to accomplish electrical connection between electrodes at a lower pressure in comparison to the case of using ACF. For example, a pressure necessary for connection between the electrodes may be 0.5 MPa to 4 MPa. In addition, bismuth and indium are metals with a low melting point, and an alloy containing these has a further lower melting point. According to this, the temperature necessary for the electrical connection between the electrodes becomes a low temperature (for example, a temperature equal to or lower than the melting point of the solder material+10° C.). Accordingly, during the connection, it is possible to reduce a stress that is applied to the circuit members due to pressure and heat. According to this, even when connecting circuit members that is thin and has low strength, a problem is less likely to occur, and it is possible to secure high reliability. In addition, when the first alloy layer and the second alloy layer are formed, a contact area between the solder portion and each of the electrodes hardly decreases even under a high temperature.

The resin portion bonds the first main surface and the second main surface to each other, and covers at least a part of the solder portion. According to this, the solder portion is reinforced, and thus the strength of the connection structure is improved. In addition, even in a case where the pitch between the electrodes is narrow, it is easy to secure insulation between the electrodes which are adjacent to each other. For example, it is preferable that the resin portion is formed to fill gaps between a plurality of solder portions which connect a plurality of light-transparent electrodes and a plurality of metal electrodes, respectively.

The resin portion may contain various additives. Examples of the additives include an activator that removes an oxide film on a surface of the solder material or the electrode surface through heating, filler, a curing agent of a resin component, and the like. The resin component is not particularly limited, and a thermosetting resin, a photo-curable resin, a thermoplastic resin, and the like can be used. Among these, the thermosetting resin is preferable, and an epoxy resin or an acrylic resin is more preferable.

The amount of bismuth, which is contained in the bismuth-indium alloy that is contained in the solder portion, is preferably in a range from 27% by mass to 68% by mass, inclusive. It is preferable that the majority of the remainder (99% by mass or greater of the remainder) of the bismuth-indium alloy is indium. The bismuth-indium alloy is excellent in wettability and connection reliability with the light-transparent electrode, and has a low melting point. For example, the bismuth-indium alloy, which is contained in the solder portion, includes at least one kind selected from the group consisting of $BiIn_2$, $Bi_3In_5$, and $BiIn$.

As described above, the connection structure of circuit members, the connection method, and the connection material of the present disclosure are useful as an alternative technology of the technology of using ACF, and it is possible to accomplish the connection structure at relatively low pressure and temperature. Accordingly, the present disclosure is particularly useful in a case of forming a connection structure including a circuit member with a low mechanical strength similar to a thin glass substrate, for example, in a case of manufacturing a small-sized liquid crystal display provided to a tablet, a smart phone, and the like.

What is claimed is:

1. A connection structure of circuit members, comprising:
    a first circuit member having a first main surface on which a light-transparent electrode is provided;
    a second circuit member having a second main surface on which a metal electrode is provided; and
    a joint portion that is interposed between the first main surface and the second main surface,
    wherein the joint portion includes a resin portion and a solder portion,
    the solder portion electrically connects the light-transparent electrode and the metal electrode,
    the light-transparent electrode contains an oxide including indium and tin, and
    the solder portion contains bismuth and indium,
    wherein the connection structure of circuit members further comprising a first alloy layer which contains indium and bismuth, is different from the solder portion, and is provided between the light-transparent electrode and the solder portion.

2. A connection structure of circuit members, comprising:
a first circuit member having a first main surface on which a light-transparent electrode is provided;
a second circuit member having a second main surface on which a metal electrode is provided; and
a joint portion that is interposed between the first main surface and the second main surface,
wherein the joint portion includes a resin portion and a solder portion,
the solder portion electrically connects the light-transparent electrode and the metal electrode,
the light-transparent electrode contains an oxide including indium and tin, and
the solder portion contains bismuth and indium,
wherein the connection structure of circuit members further comprising;
a first alloy layer which contains indium and bismuth, is different from the solder portion, and is provided between the light-transparent electrode and the solder portion, and
a second alloy layer which contains a metal component common to a metal component contained in the metal electrode, and at least one of bismuth and indium, and is provided between the metal electrode and the solder portion.

3. The connection structure of circuit members of claim 1, wherein the resin portion bonds the first main surface and the second main surface to each other, and covers at least a part of the solder portion.

4. The connection structure of circuit members of claim 1, wherein the solder portion contains a bismuth-indium alloy.

5. The connection structure of circuit members of claim 4, wherein the bismuth-indium alloy contains bismuth in a range from 27% by mass to 68% by mass, inclusive.

6. The connection structure of circuit members of claim 4, wherein the bismuth-indium alloy includes at least one selected from the group consisting of $BiIn_2$, $Bi_3In_5$, and $BiIn$.

7. The connection structure of circuit members of claim 1, wherein the solder portion is formed of a solder material that contains a bismuth-indium alloy having a melting point in a range from 72° C. to 109° C., inclusive.

8. The connection structure of circuit members of claim 1, wherein the solder portion is formed of a solder material that contains a bismuth-indium alloy having a melting point in a range from 85° C. to 109° C., inclusive.

9. The connection structure of circuit members of claim 1, wherein the solder portion is formed of a solder material that contains a bismuth-indium alloy having a melting point in a range from 88° C. to 90° C., inclusive.

10. A circuit member connection method for connecting a first circuit member having a first main surface on which a light-transparent electrode is provided, and a second circuit member having a second main surface on which a metal electrode is provided to prepare the connection structure of circuit members of claim 1, the method comprising:
preparing a connection material that contains an adhesive and a solder material dispersed in the adhesive;
disposing the first circuit member and the second circuit member in such a manner that the light-transparent electrode opposes the metal electrode oppose through the connection material;
heating at least one of the first and second circuit members while compressing the second circuit member to the first circuit member to melt the solder material, and stopping the heating to solidify the melted solder material so as to form a solder portion that electrically connects the light-transparent electrode and the metal electrode; and
curing the adhesive to form a resin portion that bonds the first circuit member and the second circuit member,
wherein the light-transparent electrode contains an oxide including indium and tin, and the solder material contains a bismuth-indium alloy.

11. The circuit member connection method of claim 10, wherein in combination of formation of the solder portion, a first alloy layer is formed between the light-transparent electrode and the solder portion, and a second alloy layer is formed between the metal electrode and the solder portion,
the first alloy layer contains a part of indium included in the light-transparent electrode and a part of bismuth included in the solder portion, and
the second alloy layer contains a metal component contained in the metal electrode and at least one of bismuth and indium contained in the solder portion.

12. The circuit member connection method of claim 10, wherein the solder material contains a bismuth-indium alloy having a melting point in a range from 72° C. to 109° C., inclusive.

13. The circuit member connection method of claim 10, wherein the solder material contains a bismuth-indium alloy having a melting point in a range from 85° C. to 109° C., inclusive.

14. The circuit member connection method of claim 10, wherein the solder material contains a bismuth-indium alloy having a melting point in a range from 88° C. to 90° C., inclusive.

15. The circuit member connection method of claim 10, wherein the solder material contains a bismuth-indium alloy, and
the bismuth-indium alloy contains indium in a range from 32% by mass to 73% by mass, inclusive.

16. The circuit member connection method of claim 10, wherein the solder material contains a bismuth-indium alloy, and
the bismuth-indium alloy contains indium in a range from 32% by mass to 49% by mass, inclusive.

17. The circuit member connection method of claim 10, wherein the solder material contains a bismuth-indium alloy, and
the bismuth-indium alloy contains indium in a range from 43% by mass to 47% by mass, inclusive.

18. The circuit member connection method of claim 10, wherein the adhesive contains an activator which reduces a surface of the light-transparent electrode through heating.

19. The circuit member connection method of claim 18, wherein the activator contains at least one selected from the group consisting of adipic acid, abietic acid, sebacic acid, glutaric acid, 4-phenylbutyric acid, and levulinic acid.

20. A connection material, which is used for a connection structure of circuit members comprising:
a first circuit member having a first main surface on which a light-transparent electrode is provided;
a second circuit member having a second main surface on which a metal electrode is provided; and
a joint portion that is interposed between the first main surface and the second main surface,
wherein the joint portion includes a resin portion and a solder portion, the solder portion electrically connects the light-transparent electrode and the metal electrode, the light-transparent electrode contains an oxide including indium and tin, and the solder portion contains bismuth and indium, wherein the connection structure of circuit members further comprising;

a first alloy layer which contains indium and bismuth, is different from the solder portion, and is provided between the light-transparent electrode and the solder portion, and a second alloy layer which contains a metal component common to a metal component contained in the metal electrode, and at least one of bismuth and indium, and is provided between the metal electrode and the solder portion, the connection material that connects a first circuit member having a first main surface on which a light-transparent electrode that contains an oxide including indium and tin is provided, and a second circuit member having a second main surface on which a metal electrode is provided, the connection material comprising:

an adhesive; and a solder material dispersed in the adhesive and containing a bismuth-indium alloy.

21. The connection material of claim 20, wherein a melting point of the bismuth-indium alloy is in a range from 72° C. to 109° C., inclusive.

22. The connection material of claim 20, wherein a melting point of the bismuth-indium alloy is in a range from 85° C. to 109° C., inclusive.

23. The connection material of claim 20, wherein a melting point of the bismuth-indium alloy is in a range from 88° C. to 90° C., inclusive.

24. The connection material of claim 20, wherein the bismuth-indium alloy contains indium in a range from 32% by mass to 73% by mass, inclusive.

25. The connection material of claim 20, wherein the bismuth-indium alloy contains indium in a range from 32% by mass to 49% by mass, inclusive.

26. The connection material of claim 20, wherein the bismuth-indium alloy contains indium in a range from 43% by mass to 47% by mass, inclusive.

27. The circuit member connection material of claim 20, wherein the adhesive contains an activator which reduces a surface of the light-transparent electrode through heating.

28. The circuit member connection material of claim 27, wherein the activator contains at least one selected from the group consisting of adipic acid, abietic acid, sebacic acid, glutaric acid, 4-phenylbutyric acid, and levulinic acid.

* * * * *